(12) United States Patent
Berger et al.

(10) Patent No.: US 10,784,145 B2
(45) Date of Patent: Sep. 22, 2020

(54) WAFER COMPOSITE AND METHOD FOR PRODUCING A SEMICONDUCTOR COMPONENT

(71) Applicant: Infineon Technologies AG, Neubiberg (DE)

(72) Inventors: Rudolf Berger, Regensburg (DE); Wolfgang Lehnert, Lintach (DE); Gerhard Metzger-Brueckl, Geisenfeld (DE); Guenther Ruhl, Regensburg (DE); Roland Rupp, Lauf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/264,071

(22) Filed: Jan. 31, 2019

(65) Prior Publication Data
US 2019/0244853 A1 Aug. 8, 2019

(30) Foreign Application Priority Data
Feb. 2, 2018 (DE) .................. 10 2018 102 415

(51) Int. Cl.
*H01L 21/762* (2006.01)
*H01L 21/02* (2006.01)
(Continued)

(52) U.S. Cl.
CPC .. *H01L 21/76251* (2013.01); *H01L 21/02002* (2013.01); *H01L 21/0254* (2013.01);
(Continued)

(58) Field of Classification Search
None
See application file for complete search history.

(56) References Cited

U.S. PATENT DOCUMENTS

2013/0119401 A1* 5/2013 D'Evelyn ........... H01L 29/2003
257/76
2014/0159065 A1 6/2014 Hu et al.
(Continued)

FOREIGN PATENT DOCUMENTS

DE 102013110126 A1 3/2014
DE 102013221788 A1 4/2015
(Continued)

OTHER PUBLICATIONS

Correia, S. A. G. D., et al., "Selective Laser Ablation of Dielectric Layers", Accessed online at https://studylib.net/doc/18769658/selective-laser-ablation-of-dielectric-layers on Jan. 31, 2019.
(Continued)

*Primary Examiner* — Asok K Sarkar
(74) *Attorney, Agent, or Firm* — Murphy, Bilak & Homiller, PLLC

(57) ABSTRACT

A wafer composite is provided which includes an auxiliary substrate, a donor substrate and a sacrificial layer formed between the auxiliary substrate and the donor substrate. Functional elements of the semiconductor component are formed in a component layer, including at least one partial layer of the donor substrate. The auxiliary substrate is then separated from the component layer by heat input into the sacrificial layer.

23 Claims, 12 Drawing Sheets

(51) Int. Cl.
    *H01L 21/304*     (2006.01)
    *H01L 21/20*     (2006.01)
    *H01L 21/78*     (2006.01)

(52) U.S. Cl.
    CPC .. *H01L 21/02381* (2013.01); *H01L 21/02428* (2013.01); *H01L 21/02524* (2013.01); *H01L 21/02667* (2013.01); *H01L 21/2007* (2013.01); *H01L 21/304* (2013.01); *H01L 21/7813* (2013.01)

(56) References Cited

U.S. PATENT DOCUMENTS

| | | |
|---|---|---|
| 2015/0371874 A1 | 12/2015 | Bower et al. |
| 2016/0163535 A1 | 6/2016 | Renauld et al. |
| 2019/0164834 A1 | 5/2019 | Or-Bach et al. |
| 2019/0378719 A1 | 12/2019 | Budd et al. |

FOREIGN PATENT DOCUMENTS

| | | |
|---|---|---|
| DE | 102015103323 A1 | 9/2016 |
| WO | 2016146584 A1 | 9/2016 |

OTHER PUBLICATIONS

Goela, Jitendra S., "CVD Growth and Characterization of β-SiC for IR Windows", Conference Proceedings Morton Advanced Materials, 1998.

Poulain, G., et al., "Laser Ablation Mechanism of Silicon Nitride Layers in a Nanosecond UV Regime", Energy Procedia, vol. 27, 2012, pp. 516-521.

Sakamoto, Jeffrey, et al., "Mo/Ti Diffusion Bonding for Making Thermoelectric Devices", NASA Tech Briefs, Jul. 2007, Accessed online at https://ntrs.nasa.gov/search.jsp?R=20100002847 on Jan. 31, 2019, p. 13.

\* cited by examiner

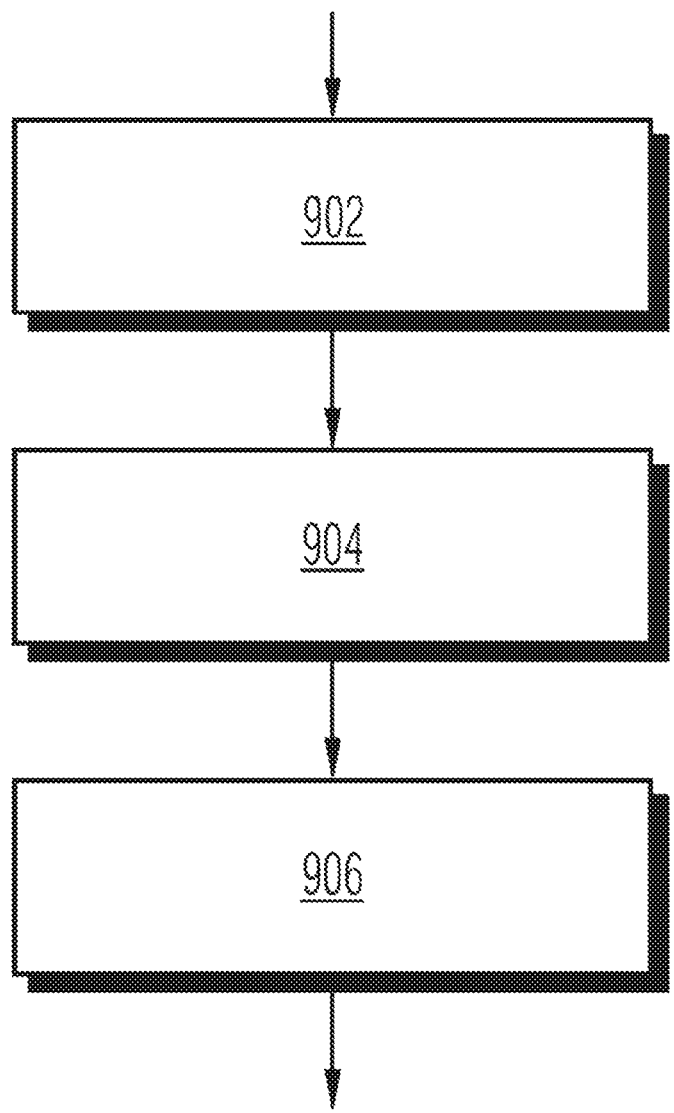

WAFER COMPOSITE AND METHOD FOR PRODUCING A SEMICONDUCTOR COMPONENT

BACKGROUND

Semiconductor components are typically fabricated in substrates sliced from a cylindrical, monocrystalline crystal. As an alternative thereto, semiconductor components can also be fabricated in semiconductor layers that grow on a suitable support with a monocrystalline seed layer. In this case, the support can become a constituent of the finished component and/or it can be at least partly removed in a grinding process before the component is completed.

There is a need for alternative methods which make it possible, in a cost-effective manner, to provide monocrystalline semiconductor layers having high crystal quality for fabricating semiconductor components.

SUMMARY

The present disclosure relates to a method for producing a semiconductor component. To that end, a wafer composite is provided which comprises an auxiliary substrate, a donor substrate and a sacrificial layer formed between the auxiliary substrate and the donor substrate. Functional elements of the semiconductor component are formed in a component layer, comprising at least one partial layer of the donor substrate. The auxiliary substrate is then separated from the component layer by means of heat input into the sacrificial layer.

The present disclosure furthermore relates to a wafer composite comprising a donor substrate and an auxiliary substrate. A sacrificial layer is formed between the auxiliary substrate and the donor substrate, said sacrificial layer being thermally stable and solid up to at least 1200° C.

BRIEF DESCRIPTION OF THE DRAWINGS

The accompanying drawings serve to afford an understanding of exemplary embodiments of the method and of the wafer composite, are included in the disclosure and form part thereof. The drawings merely illustrate exemplary embodiments and together with the description serve to elucidate the principles thereof. The wafer composite described here and the method described here are therefore not restricted to the exemplary embodiments by the description thereof. Further exemplary embodiments and numerous advantages from among those intended are evident directly from the following detailed description and from combinations of the exemplary embodiments described below, even if they are not explicitly described. The elements and structures shown in the drawings are not necessarily illustrated in a manner true to scale with respect to one another. Identical reference signs refer to identical or mutually corresponding elements and structures.

FIG. 1 shows a simplified flow diagram for a method for producing semiconductor components from a donor substrate in which, by thermally decomposing a sacrificial layer, a component layer originating from the donor substrate is separated from an auxiliary substrate, in accordance with one embodiment.

DETAILED DESCRIPTION

Figure 2A:
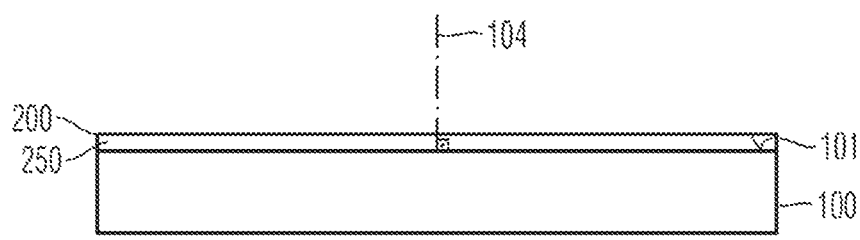
FIG. 2A shows a schematic vertical cross section through a donor substrate after applying a layer structure comprising a sacrificial layer on the donor substrate in order to illustrate a method for producing semiconductor components in accordance with one embodiment.

In the following detailed description, reference is made to the accompanying drawings, which form part of the disclosure and show specific exemplary embodiments for illustration purposes. In this context, a direction terminology such as "top side", "bottom", "front side", "rear side", "at the front", "at the back", etc. is related to the orientation of the figures currently being described. Since the component parts of the exemplary embodiments can be positioned in different orientations, the direction terminology is used only for explanation purposes and is in no way limiting.

It goes without saying that other exemplary embodiments also exist and structural or logical changes can be made, without departing in the process from the scope defined by the patent claims. The description of the exemplary embodiments is non-limiting in this respect. In particular, elements of each of the exemplary embodiments described below can be combined with elements from other exemplary embodiments from among those described, unless something different is evident from the context.

Insofar as the terms "have", "contain", "encompass", "comprise" and the like are used here, they are open terms which indicate the presence of the stated elements or features, but do not exclude the existence of further elements or features. The indefinite articles and the definite articles encompass both the plural and the singular, unless something different is unambiguously evident from the context. Range indications which indicate a lower and/or an upper limit include the limit(s).

If a value range with the indication of one limit value or two limit values is defined for a physical variable, then the prepositions "from" and "to" include the respective limit value. An indication of the type "from . . . to" is accordingly understood as "from at least . . . to at most".

In accordance with FIG. 1, a method for producing a semiconductor component comprises providing a wafer composite comprising an auxiliary substrate, a donor substrate and a sacrificial layer formed between the auxiliary substrate and the donor substrate (902). Functional elements are formed in a component layer comprising at least one partial layer of the donor substrate (904).

The functional elements can be for example pn junctions, doped regions of diodes and/or transistor cells, resistors and/or electrical lines which determine the electrical functionality of the semiconductor component.

Forming the functional elements can be preceded by, inter alia, horizontally splitting the donor substrate and/or growing epitaxial layers on the side of the donor substrate. After forming the functional elements, the auxiliary substrate is separated from the component layer by means of heat input into the sacrificial layer (906). The heat input is effected for example by impingement with a pulsed laser beam that penetrates through the auxiliary substrate and focuses in the region of the sacrificial layer. In this case, the material of the sacrificial layer is at least partly decomposed and/or at least partly melts. The auxiliary substrate is maintained substantially unchanged and can be reused for producing a further semiconductor component.

In accordance with one embodiment, before forming the functional elements, a layer thickness of the component layer is increased, e.g. by means of an epitaxial method. The method thus makes it possible, inter alia, to produce electronic components in epitaxial layers which grow on thin crystalline seed layers obtained from a donor substrate. With regard to the content of impurities and/or with regard to a basic doping, the epitaxial layers can be adapted to predefined requirements more easily than a crystal pulled in a melt method. Moreover, the total thickness of the component layer can be established comparatively precisely and is subject only to minor fluctuations. In the case of vertical power semiconductor components having a load current flow through two opposite main surfaces, the heat input required for separating component layer and auxiliary substrate can contribute to a conditioning of the component rear side.

In accordance with one embodiment, the donor substrate comprises a first crystalline semiconductor material and the auxiliary substrate comprises a second crystalline semiconductor material. The first and second crystalline semiconductor materials can comprise different or the same main constituents.

By way of example, the main constituent of the donor substrate and of the auxiliary substrate is in each case silicon or the main constituent of the donor substrate and of the auxiliary substrate is in each case silicon carbide. Here and hereinafter a main constituent of a component part, e.g. of the donor substrate or of the auxiliary substrate, can be taken to mean the material system on which said component part is based. By way of example, the component part in this case consists of the main constituent, with the exception of production-dictated impurities and/or dopants.

By way of example, the first and second crystalline semiconductor materials comprise the same main constituents and differ only in the doping and/or the crystal shape, that is to say with regard to the crystal type, the polytype and/or the absence or presence of grain boundaries, wherein such grain boundaries exist between crystallites in a polycrystalline semiconductor material and such grain boundaries are absent in monocrystalline or amorphous semiconductor material.

Besides the sacrificial layer, the layer structure can comprise one or a plurality of auxiliary layers, for example adhesion layers which enable and/or facilitate bonding between that part of the wafer composite which comprises the donor substrate and that part of the wafer composite which comprises the auxiliary substrate, reflection layers which make it more difficult for the laser radiation to penetrate into the component layer, and/or thermal protection layers which reduce a heat input into the component layer and/or absorb the energy introduced and transfer it to the sacrificial layer. Alternatively or additionally, the layer structure can comprise one or a plurality of functional layers which are permanently connected to the component layer in the course of the method and fulfil a technical function in the finalized semiconductor component, e.g. as rear-side metallization or rear-side electrode.

FIGS. 2A to 2E show, on the basis of vertical cross sections through a donor substrate 100 and an auxiliary substrate 300, different phases of the method from FIG. 1 in accordance with one embodiment in which a sacrificial layer 250 is formed completely on a donor substrate 100.

A layer structure 200 comprising at least one first sacrificial layer 250 is formed on a first substrate surface 101 of a donor substrate 100.

FIG. 2A shows the donor substrate 100. The donor substrate 100 is a flat disk consisting of a monocrystalline semiconductor material, for example silicon (Si), germanium (Ge), silicon-germanium (SiGe), silicon carbide (SiC), or of a compound semiconductor, for example gallium nitride (GaN) or gallium arsenide (GaAs), wherein the monocrystalline semiconductor material can contain production-dictated impurities and/or dopants.

The donor substrate 100 has a first substrate surface 101 on the front side and a second substrate surface 102 parallel to the first substrate surface 101 on the rear side facing away from the front side. A normal 104 to the first substrate surface 101 defines a vertical direction. Directions parallel to the first substrate surface 101 are horizontal directions.

The thickness of the donor substrate 100 between the first substrate surface 101 and the second substrate surface 102 lies in a range of from at least 50 μm to at most 1500 μm. The horizontal cross section through the donor substrate 100 can be an ellipse, in particular a circle, having a notch or having a flattened portion on the circle circumference or a rectangle having rounded corners.

The layer structure 200 comprises at least one sacrificial layer 250. The sacrificial layer 250 is thermally stable at least up to the highest of the temperatures required hereinafter for processing the semiconductor components, wherein the sacrificial layer 250 neither melts nor thermally decomposes up to at least 1200° C.

If the donor substrate 100 is based on SiC, then the sacrificial layer 250 is thermally stable up to at least 1700° C. and can decompose with the release of gaseous decomposition products at a temperature of between 1700° C. and 2000° C. By way of example, the sacrificial layer 250 predominantly, i.e. to the extent of at least 95%, in particular at least 99%, contains silicon nitride or completely consists of silicon nitride. By way of example, the sacrificial layer 250 contains silicon nitride as main constituent and contains only production-dictated impurities.

If the donor substrate 100 is based on silicon or gallium nitride, for example, then the sacrificial layer 250 can be thermally stable up to at least 1200° C. By way of example, the sacrificial layer 250 can then comprise a silicon oxide having a melting point of above 1200° C. or can predominantly consist of such a silicon oxide.

Besides the sacrificial layer 250, the layer structure 200 can comprise further auxiliary layers formed in each case either between the sacrificial layer 250 and the donor substrate 100 or on that side of the sacrificial layer 250 which faces away from the donor substrate 100.

The donor substrate 100 is connected to an auxiliary substrate 300 via the layer structure 200, for example by bonding or adhesive bonding, wherein in the case of bonding the layer structure 200 is applied directly to a main surface 301 of the auxiliary substrate 300, and in the case of adhesive bonding firstly an adhesive layer is applied to the main surface 301, to the surface of the layer structure 200 or in two partial layers both to the main surface 301 and to the surface of the layer structure 200.

In the case of bonding (direct bonding), the adhesion between two touching and sufficiently planar surfaces is based on van der Waals forces, hydrogen bridge bonds, and/or chemical bonds of metallic, ionic or covalent nature, wherein the surfaces of two layers composed of the same material or composed of two different materials can be involved. Bonding can comprise pressing the two surfaces against one another, a thermal treatment of the touching surfaces or a combination of both (fusion bonding, thermocompressive bonding, bonding by atomic rearrangement). Alternatively, bonding can comprise anodic bonding, in which, during a thermal treatment, an electric field is applied over the connection area and/or a current flows through the connection area.

Figure 2B:
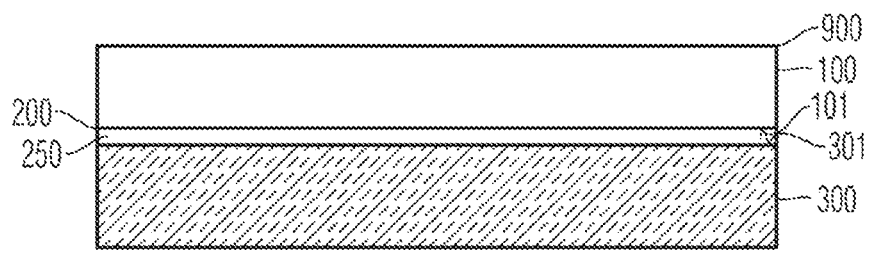
FIG. 2B shows a schematic vertical cross section through a wafer composite comprising a donor substrate and an auxiliary substrate.

FIG. 2B shows a wafer composite 900, comprising the donor substrate 100 and the auxiliary substrate 300, wherein the layer structure 200 is arranged between the first substrate surface 101 of the donor substrate 100 and a main surface 301 of the auxiliary substrate 300.

The auxiliary substrate 300 can comprise as main constituent a material which has the same coefficient of thermal expansion as the donor substrate 100 or the coefficient of thermal expansion of which deviates only very slightly, for example by less than 1 ppm, from the coefficient of thermal expansion of the donor substrate 100.

By way of example, auxiliary substrate 300 and donor substrate 100 are based on a crystal structure composed of the same elements, i.e. having identical atomic constituents, and differ at most with regard to the absence or the presence of grain boundaries, with regard to the crystal morphology and/or with regard to a doping. By way of example, both the donor substrate 100 and the auxiliary substrate 300 are composed of the same crystalline semiconductor material, for example composed of SiC, GaN or GaAs, wherein the donor substrate 100 is monocrystalline and the auxiliary substrate 300 can be monocrystalline or polycrystalline. By way of example, the donor substrate 100 is composed of monocrystalline SiC of a first polytype and the auxiliary substrate 300 is composed of monocrystalline SiC of the first or a different polytype. In accordance with one embodiment, the donor substrate is monocrystalline SiC and the auxiliary substrate 300 is an intrinsically conducting, monocrystalline SiC wafer of the same polytype. By way of example, the auxiliary substrate 300 is a semi-insulating, crystalline SiC wafer having an electrical resistivity of at least $10^3$ Ωcm or of at least $10^6$ Ωcm.

In accordance with other embodiments, the auxiliary substrate 300 and the donor substrate 100 are based on crystals composed of different elements, in particular composed of different main constituents. By way of example, the auxiliary substrate 300 is based on an SiC crystal and the donor substrate 100 is based on a GaN crystal.

The auxiliary substrate 300 can have the same horizontal cross-sectional shape as the donor substrate 100, wherein a diameter of the auxiliary substrate 300 can correspond to the diameter of the donor substrate 100 or can be greater than the diameter of the donor substrate 100. By way of example, the auxiliary substrate 300 can be a circular disk having a diameter of 76.2 mm, 100 mm, 125 mm, 127 mm, 150 mm, 200 mm or 300 mm. A thickness of the auxiliary substrate 300 between the first main surface 301 on the front side and a rear-side surface 302 on the rear side can lie for example in a range of from 300 µm to 1200 µm.

Before connecting to the donor substrate 100, a further layer structure can be applied to the auxiliary substrate 300, e.g. an adhesion auxiliary layer composed of a material suitable for bonding to the outermost layer of the layer structure 200 formed on the donor substrate 100. In accordance with one embodiment, an adhesion auxiliary layer composed of the material of the outermost layer of the layer structure 200 can be applied to the auxiliary substrate 300, such that two layers composed of the same material can be connected by bonding.

Afterward, the wafer composite 900 can be conditioned in various ways, wherein functional elements 190 of semiconductor components are ultimately formed in a component layer 110 originating from the donor substrate 100. Conditioning the donor substrate 100 can comprise horizontally splitting off a main part of the donor substrate 100 from a partial layer of the donor substrate on which the final component layer 110 is based, and/or growing epitaxial layers, wherein the layer thickness of the component layer 110 can be increased.

Figure 2C:
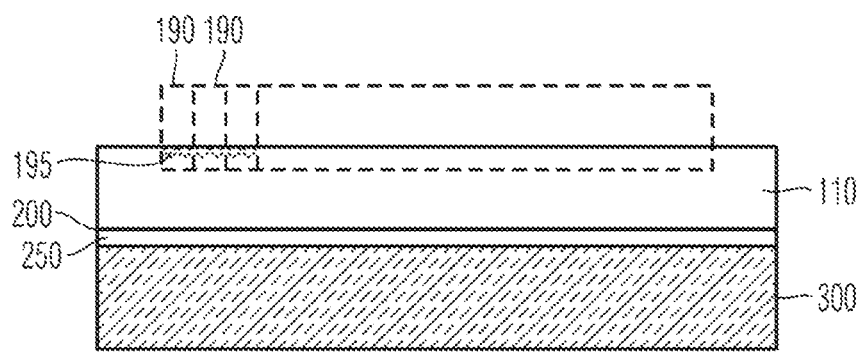
FIG. 2C shows a wafer composite after forming functional elements in a component layer originating from the donor substrate.

FIG. 2C schematically shows a component layer 110 with functional elements 190 that is formed from at least parts of the donor substrate 100 from FIG. 2B. The functional elements comprise for example diodes, transistors, resistors and/or electrical lines and have at least partly doped regions 195 within the component layer 110. On the front side of the component layer 110, further layers can be applied, for example metallization layers and insulation layers between different metallization layers or between an innermost metallization layer and the component layer 110.

The auxiliary substrate 300 is separated from the component layer 110 for example by decomposing and/or melting the sacrificial layer 250. In this case, the sacrificial layer 250 is heated to above its decomposition temperature or its melting point by means of selective heat input. The heat input can be effected by means of pulsed laser radiation, for example. In this case, the laser beam can be guided through the donor substrate 100 or through the auxiliary substrate 300 and focused in the region of the sacrificial layer 250.

The wavelength of the laser beam and the material of the auxiliary substrate 300 and also the material of the sacrificial layer 250 are coordinated with one another such that the auxiliary substrate 300 is sufficiently transparent at the wavelength of the laser and sufficient energy is introduced into the sacrificial layer 250. The energy density of the laser beam (laser energy density), pulse duration and/or duty cycle are coordinated with one another such that the heat generated by the laser irradiation reaches the functional elements 190 formed on the front side of the component layer 110 only to a small extent.

By way of example, the wavelength of the laser lies in a range of from 300 nm to 10 µm and the energy density of the laser beam lies in a range of from 1 J/cm² to 5 J/cm² nm. Given an average energy density of the laser beam of 3 J/cm², the pulse duration can lie in a range of from 1 ps to 100 µs, for example in a range of from 1 ps to 500 µs.

By way of example, a semi-insulating, crystalline SiC wafer having an electrical resistivity of at least $10^3$ Ωcm or of at least $10^6$ Ωcm as auxiliary substrate 300 can have a sufficient transparency of at least 30%, e.g. at least 40%, to the laser beam. By way of example, the wavelength of the laser beam lies in a range of from 500 nm to 5.6 µm and the transparency of a semi-insulating crystalline SiC wafer having a layer thickness of 500 µm is at least 40%.

Figure 2D:
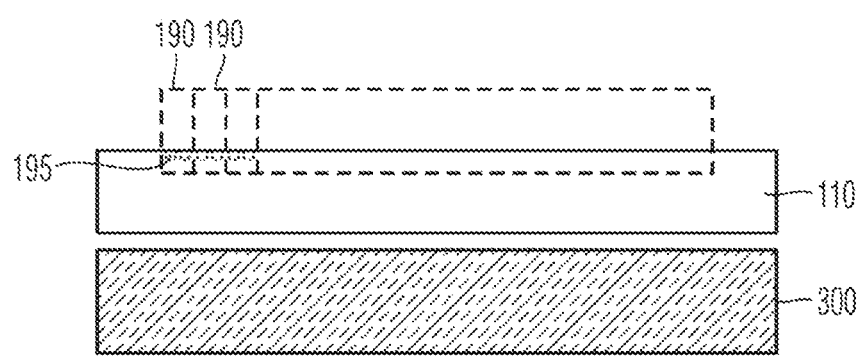
FIG. 2D shows a wafer composite comprising a component layer during thermal decomposition of the sacrificial layer.

FIG. 2D shows the breakdown of the wafer composite 900 in FIG. 2D by selectively removing the sacrificial layer 250. After separating off the auxiliary substrate 300, the main surface 301 of the auxiliary substrate 300 can be subjected to a cleaning process, for example a wet etching process for removing residues of the sacrificial layer. A polishing process can restore the planarity of the first main surface 301 that is suitable for bonding.

Figure 2E:
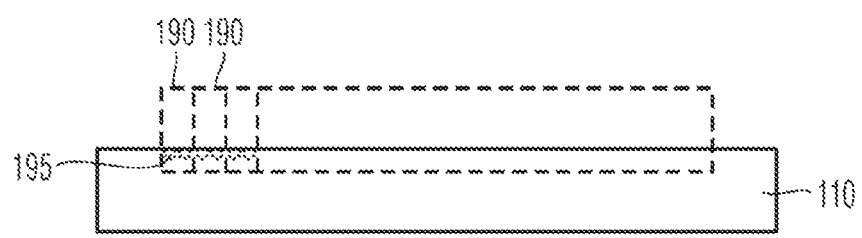
FIG. 2E shows a component layer separated off from an auxiliary substrate.

FIG. 2E shows the component layer 110 separated off, at least doped regions 195 of functional elements 190 of semiconductor components being formed in said component layer.

Figure 3A:
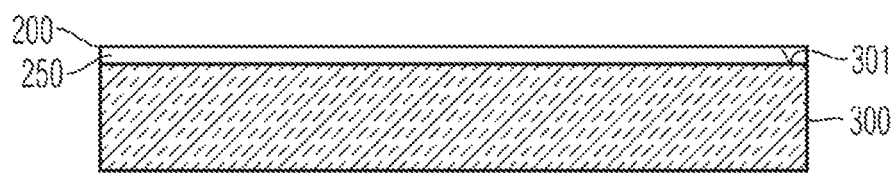
FIG. 3A shows a schematic vertical cross section through an auxiliary substrate with sacrificial layer in order to illustrate a method for producing semiconductor components in accordance with another embodiment.
Figure 3B:
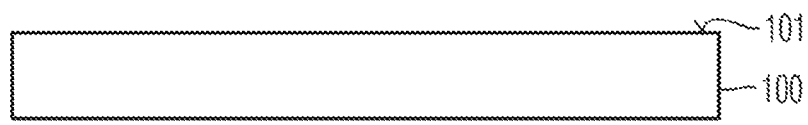
FIG. 3B shows a schematic vertical cross section through a donor substrate.
Figure 3C:
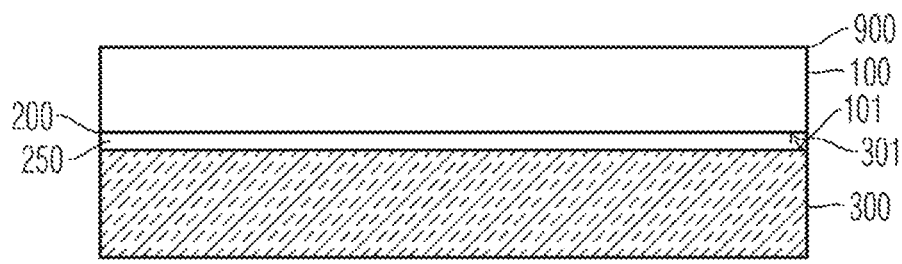
FIG. 3C shows a schematic vertical cross section through a wafer composite comprising the donor substrate from FIG. 3B and the auxiliary substrate from FIG. 3A.

FIGS. 3A to 3C relate to a method in which the sacrificial layer 250 is formed completely on the side of the auxiliary substrate 300.

FIG. 3A shows an auxiliary substrate 300 with a layer structure 200 comprising the sacrificial layer 250 on a main surface 301 of the auxiliary substrate 300.

FIG. 3B shows a donor substrate 100 composed of a monocrystalline semiconductor material, the first substrate surface 101 of which is uncovered. Alternatively, on the first substrate surface 101, a further layer structure without a sacrificial layer can be applied, e.g. an adhesion auxiliary layer composed of a material suitable for bonding to the outermost layer of a layer structure 200 formed on the auxiliary substrate 300.

Auxiliary substrate 300 and donor substrate 100 are fixedly connected to one another by bonding or adhesive bonding via the layer structure 200.

FIG. 3C shows the wafer composite 900 formed by connecting auxiliary substrate 300 and donor substrate 100. For details of the wafer composite 900 and the further processing, reference is made to the description of FIGS. 2B to 2E.

Figure 4A:
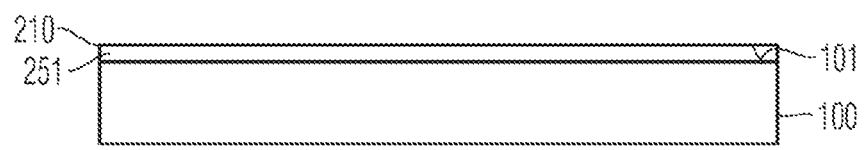
FIG. 4A shows a schematic vertical cross section through a donor substrate after applying a first layer structure in order to illustrate a method for producing semiconductor components in accordance with a further embodiment.
Figure 4B:
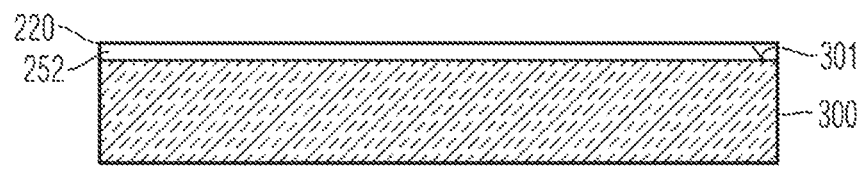
FIG. 4B shows a schematic vertical cross section through an auxiliary substrate with a second layer structure.
Figure 4C:
FIG. 4C shows a schematic vertical cross section through a wafer composite comprising the donor substrate from FIG. 4A and the auxiliary substrate from FIG. 4B.

FIGS. 4A to 4C relate to a method in which the sacrificial layer 250 is formed partly on the side of the donor substrate 100 and partly on the side of the auxiliary substrate 300.

A first layer structure 210 comprising a first partial sacrificial layer 251 is applied to a first substrate surface 101 of a donor substrate 100 and a second layer structure 220 comprising a second partial sacrificial layer 252 is applied on a main surface 301 of the auxiliary substrate 300.

FIG. 4A shows the donor substrate 100 with a first layer structure 210 comprising the first partial sacrificial layer 251 on a first substrate surface 101 of the donor substrate 100. The first partial sacrificial layer 251 can be the sole layer of the first layer structure 210 or the outermost layer of a multilayered first layer structure 210.

FIG. 4B shows the auxiliary substrate 300 with a second layer structure 220 comprising the second partial sacrificial layer 252 on a main surface 301 of the auxiliary substrate 300. The second partial sacrificial layer 252 can be the sole layer of the second layer structure 220 or the outermost layer of a multilayered second layer structure 220.

The first layer structure 210 and the second layer structure 220 can have an identical construction, but can differ from one another both with regard to the number of partial layers and with regard to the composition and the thickness of the partial layers. By way of example, only the first layer structure 210 can comprise an auxiliary layer, e.g. a reflection, thermal protection and/or metallization layer, or only the second layer structure 220 can comprise one or a plurality of such auxiliary layers.

The donor substrate 100 is connected to the auxiliary substrate 300, wherein a surface of the first layer structure 210 is brought into contact with a surface of the second layer structure 220 and they are permanently and irreversibly connected to one another by bonding, and wherein two layers composed of the same material are connected by the bonding. The two layers composed of the same material are e.g. the two partial sacrificial layers 251, 252. By way of example, the two partial sacrificial layers 251, 252 are composed of silicon nitride or predominantly contain silicon nitride.

FIG. 4C shows a wafer composite 900 formed by connecting auxiliary substrate 300 and donor substrate 100. A layer structure 200 comprises the first layer structure 210 and the second layer structure 220. A sacrificial layer 250 comprises the two partial sacrificial layers 251, 252 directly adjoining one another. For further details of the wafer composite 900 and of the further processing, reference is made to the description of FIGS. 2B to 2E.

FIGS. 5A to 5H show a production method for semiconductor components which combines the process of separating a component layer from an auxiliary substrate by means of a sacrificial layer which is meltable and/or thermally decomposable only at comparatively high temperatures with a wafer splitting method.

A defect layer 170 can be produced at a distance from a first substrate surface 101 of a donor substrate 100, for example by implantation of light ions 175, e.g. hydrogen or helium, through the first substrate surface 101 or by laser irradiation, which leads to a planar disturbance of the crystal structure of the donor substrate.

Figure 5A:
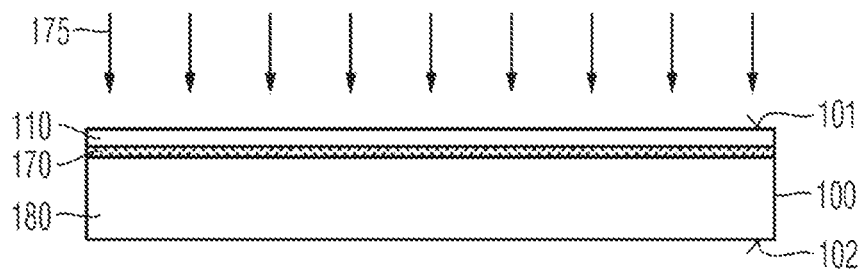
FIG. 5A shows a schematic vertical cross section through a donor substrate when producing a defect layer in order to illustrate a method for producing components in accordance with one embodiment relating to a horizontal wafer cut.

FIG. 5A shows the donor substrate 100 with a horizontal defect layer 170, which can be formed over the entire cross-sectional area of the donor substrate 100. The section of the donor substrate 100 between the first substrate surface 101 and the defect layer 170 remains largely unaffected by the implantation and subsequently forms the basis of a component layer 110.

The defect layer 170 separates the component layer 110 from a main part 180 of the donor substrate 100. The defect layer 170 has a high density of crystal imperfections, e.g. defects, interstitial atoms and/or, in the case of an implantation with hydrogen, complexes formed by hydrogen atoms bonded to lattice defects. The distance between the defect layer 170 and the substrate surface 101 is for example 1 μm to 20 μm. A first layer structure 210 is applied to the substrate surface 101.

Figure 5B:
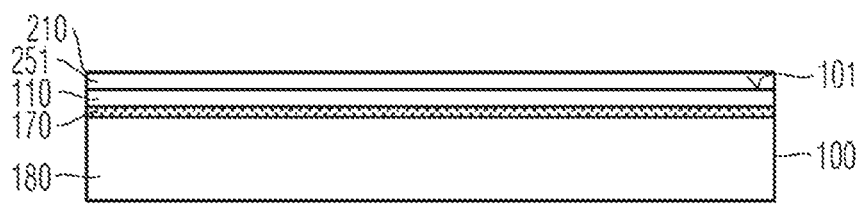
FIG. 5B shows a schematic vertical cross section through the donor substrate from FIG. 5A after applying a first layer structure.

FIG. 5B shows the first layer structure 210 formed on the first substrate surface 101, which first layer structure can comprise a sacrificial layer or at least one first partial sacrificial layer 251 and/or an auxiliary layer, e.g. a metallization layer.

A second layer structure 220 is formed on a main surface 301 of an auxiliary substrate 300, which second layer structure can comprise a sacrificial layer, a second partial sacrificial layer 252 and/or at least one further auxiliary layer, e.g. a metallization layer, wherein either the first or the second layer structure 210, 220 comprises a sacrificial layer or both layer structures 210, 220 comprise partial sacrificial layers 251, 252.

The first layer structure 210 of the donor substrate 100 is fixedly and permanently connected to the second layer structure 220 on the auxiliary substrate 300 e.g. by bonding.

Figure 5C:
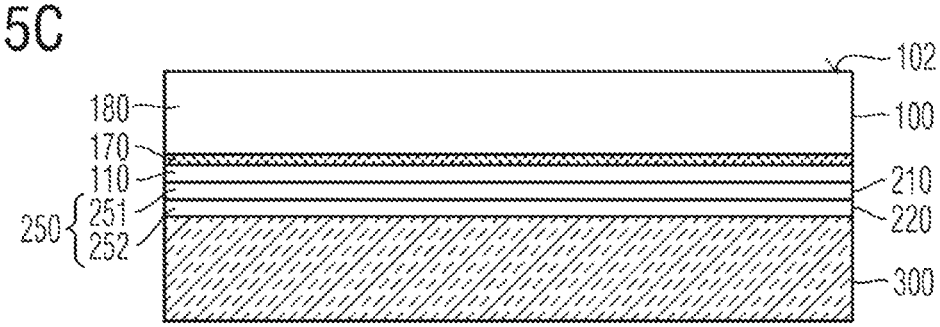
FIG. 5C shows a schematic vertical cross section through a wafer composite comprising the donor substrate in accordance with FIG. 5B and an auxiliary substrate with a second layer structure.

FIG. 5C shows a wafer composite 900 comprising the donor substrate 100, which is connected to the auxiliary substrate 300 via the first layer structure 210 and the second layer structure 220. The two partial sacrificial layers 251, 252 form a sacrificial layer 250.

The main part 180 of the donor substrate 100 is separated off from the component layer 110 along the defect layer 170. Separating off can comprise a thermal treatment at a temperature at which hydrogen atoms implanted into the defect layer 170 are rearranged and form pores, with the result that the mechanical stability of the defect layer 170 is reduced and the main part 180 of the donor substrate 100 can be split off from the component layer 110 by weak mechanical force action.

Figure 5D:
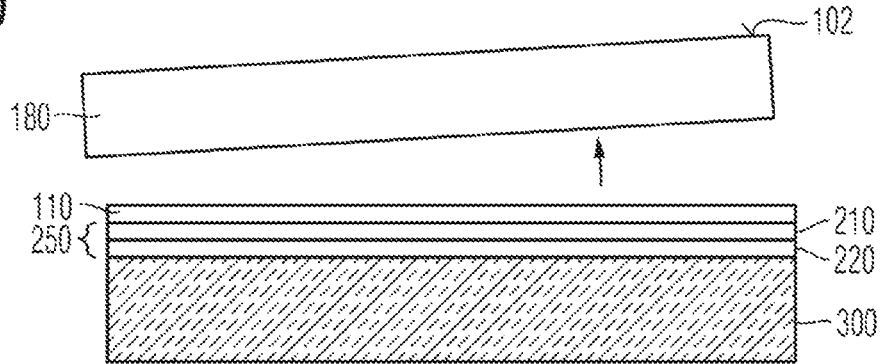
FIG. 5D shows a schematic vertical cross section through the wafer composite according to FIG. 5C when splitting off a main part of the donor substrate from a component layer along the defect layer.

FIG. 5D shows the process of separating the main part 180 of the donor substrate 100 from the component layer 110.

In accordance with another embodiment, the main part 180 of the donor substrate 100 is separated off by laser radiation acting along the separating line or by means of applying a polymer layer and subsequently producing thermomechanical stresses, wherein the step of implantation of light ions as shown in FIG. 5A is omitted in each case.

Figure 5E:
FIG. 5E shows a schematic vertical cross section through the wafer composite from FIG. 5D after splitting off the main part of the donor substrate.

FIG. 5E shows the remaining wafer composite 900 comprising the component layer 110, which is connected to the auxiliary substrate 300 via the first and second layer structures 210, 220. The layer thickness of the component layer 110 can be increased, for example by means of an epitaxial method, in the course of which atoms of the semiconductor material are fed to the component layer 110, which atoms deposit on an exposed process surface 105 on the front side of the component layer 110 and in the process take up and continue the crystal structure of the component layer 110.

Figure 5F:
FIG. 5F shows a schematic vertical cross section through the wafer composite from FIG. 5E after extending the component layer by an epitaxial layer.

FIG. 5F shows the component layer 110 after the epitaxy process. A layer thickness of the component layer 110 after the epitaxy process can be for example at least 10 μm, for example at least 25 μm or at least 50 μm.

In the component layer 110 from FIG. 5F, doped regions 195 of functional elements 190 of semiconductor components are formed at least along the process surface 105. Further functional elements, for example gate electrodes, connection structures and/or insulator structures, can be formed in further layers applied on the process surface 105 of the component layer 110.

Before or after applying further insulation and metallization layers with further functional elements of the semiconductor components, an auxiliary carrier 400 can be secured on the side of the process surface 105. The auxiliary carrier 400 can be a glass carrier, for example, which is secured on the front side of the component layer 110 by means of a bonding or adhesive bonding method.

Figure 5G:
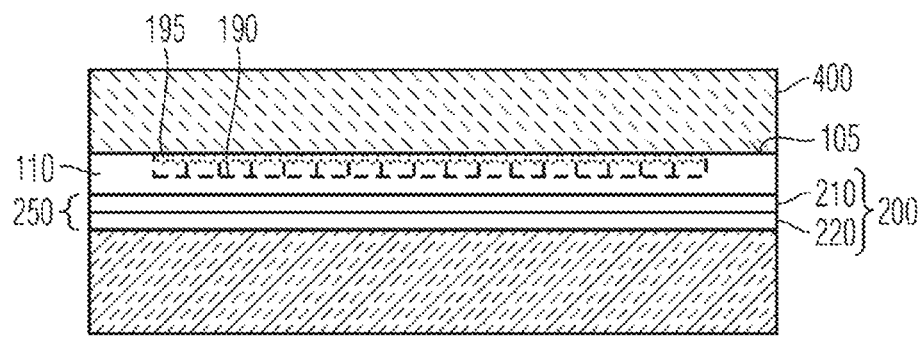
FIG. 5G shows a schematic vertical cross section through the wafer composite from FIG. 5F after forming functional elements and after applying an auxiliary carrier on the side of the component layer.

In accordance with FIG. 5G, the wafer composite 900 at this stage comprises the auxiliary substrate 300, the component layer 110, which is connected to the auxiliary substrate 300 via a layer structure 200 comprising the first and second layer structures 210, 220, and also the auxiliary carrier 400, which is connected to the component layer 110 directly or via insulation and metallization layers on the opposite side of the component layer 110 relative to the auxiliary substrate 300. The auxiliary carrier 400 is composed of a glass, for example.

Figure 5H:
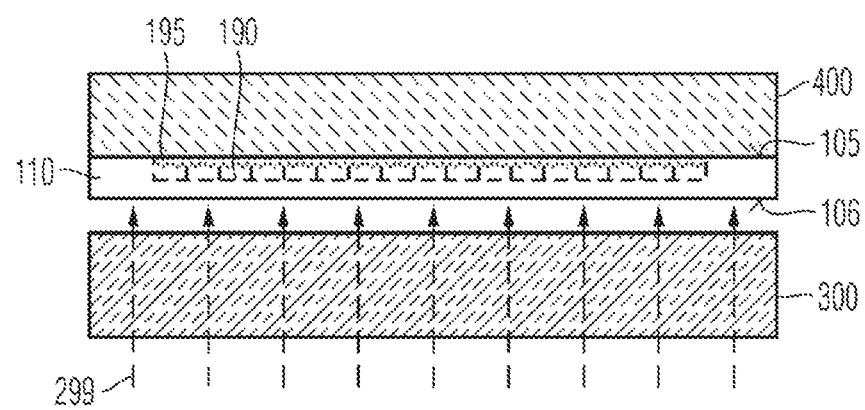
FIG. 5H shows a schematic vertical cross section through the wafer composite from FIG. 5G during impingement with a laser beam for separating off the auxiliary substrate.

In accordance with FIG. 5H, through the auxiliary substrate 300 laser radiation 299 can be focused in the region of the sacrificial layer 250, such that the sacrificial layer 250 heats up and decomposes and/or melts largely selectively with respect to the component layer 110 and with respect to the auxiliary substrate 300. The laser light has a high energy, a wavelength at which the auxiliary substrate 300 is sufficiently transparent, and is applied in short pulses.

After separating off the auxiliary substrate 300, the main surface 301 can be reconditioned for a further process cycle, for example by means of a chemical/physical cleaning method which can use a solvent for removing residues of the sacrificial layer. The reconditioning of the auxiliary substrate 300 can comprise a polishing method.

A rear-side surface 106 of the component layer 110 can be subjected to a similar cleaning and possibly polishing process and a rear-side processing possibly required can be concluded.

In accordance with one embodiment relating to the production of vertical semiconductor components with a current flow from one component side to the opposite component side, the rear-side processing can comprise further implantations, for example implanting hydrogen ions for producing field stop or buffer layers, or implanting donor and/or acceptor ions for producing highly doped contact regions. The rear-side processing can comprise a local laser irradiation of the exposed rear-side surface 106 and/or of a region of the component layer 110 near the rear-side surface 106. As a result, implantation damage can be locally annealed, dopants can be locally activated and/or the adhesion of metal layers can be improved. Alternatively or additionally, the rear-side processing can comprise depositing one or a plurality of metallization layers.

FIGS. 6A to 6H relate to a method in which a layer structure comprises at least one auxiliary layer which for example increases the efficiency of the laser radiation for the decomposition of the sacrificial layer and/or can serve as metallization layer of the semiconductor components.

Figure 6A:
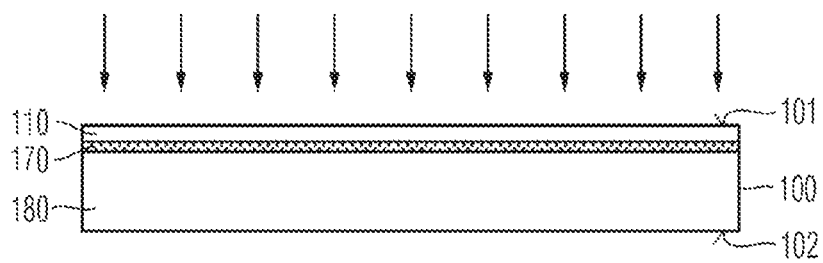
FIG. 6A shows a schematic vertical cross section through a donor substrate when producing a defect layer in order to illustrate a method for producing components in accordance with one embodiment relating to a layer structure comprising auxiliary layers.

In accordance with FIG. 6A, a horizontal defect layer 170 can be produced by implantation of light ions through a first substrate surface 101 between a component layer 110 and a main part 180 of the donor substrate 100. A first layer structure 210 is formed on the first substrate surface 101.

Figure 6B:
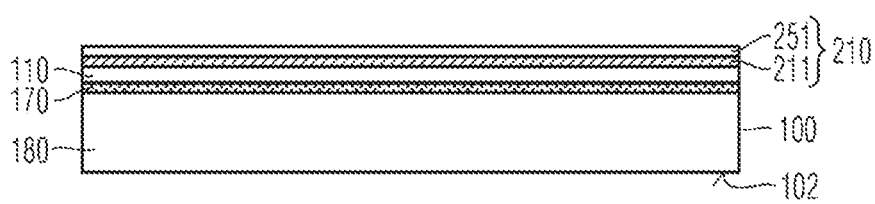
FIG. 6B shows a schematic vertical cross section through the donor substrate from FIG. 6A after applying a first layer structure comprising a first auxiliary layer.

According to FIG. 6B, the first layer structure 210 comprises at least one first auxiliary layer 211 which can be applied directly on the first substrate surface 101. The first auxiliary layer 211 can have for example a higher reflection factor than the donor substrate 100 at the wavelength of the laser beam used in the further course of the method, the material of the first auxiliary layer 211 can have a poorer specific thermal conductivity and/or a higher specific heat capacity than the material of the donor substrate 100 and/or the first auxiliary layer 211 can be a metal-containing layer. By way of example, the first auxiliary layer 211 can contain a nickel alloy, a copper alloy and/or an aluminum alloy or consist of a nickel alloy, a copper alloy or an aluminum alloy.

The first layer structure 210 can additionally comprise a first partial sacrificial layer 251 formed on the first auxiliary layer 211. The first partial sacrificial layer 251 can consist of or contain silicon nitride.

A second layer structure 220 can be applied on the main surface 301 of an auxiliary substrate 300. The second layer structure 220 can comprise a second auxiliary layer 221, which can be applied directly on the main surface 301. The second auxiliary layer 221 can have for example a poorer thermal conductivity and/or a higher heat capacity than the material of the auxiliary substrate 300. By way of example, the second auxiliary layer 221 can be a metal-containing layer which is thin enough to be transmissive to the laser radiation applied subsequently.

The second layer structure 220 can additionally comprise a second partial sacrificial layer 252 formed on the second auxiliary layer 221, wherein the first partial sacrificial layer 251 and the second partial sacrificial layer 252 can be composed of the same material. As an alternative to the two partial sacrificial layers 251, 252, it is also possible for only a single sacrificial layer 250 to be applied on either the auxiliary substrate 300 or the donor substrate 100. Donor substrate 100 and auxiliary substrate 300 are connected to one another by bonding e.g. the first partial sacrificial layer 251 onto the second partial sacrificial layer 252.

Figure 6C:
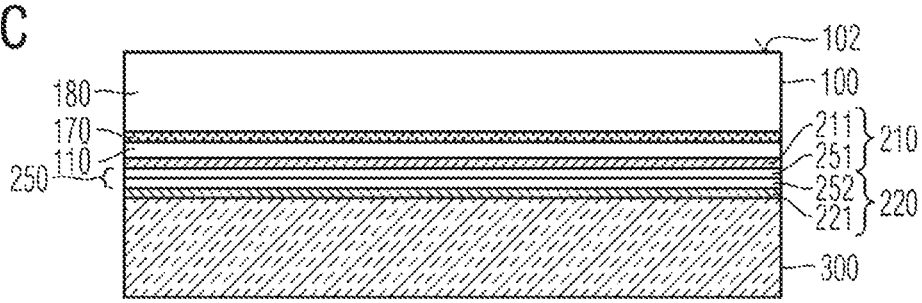
FIG. 6C shows a schematic vertical cross section through a wafer composite comprising the donor substrate in accordance with FIG. 6B and an auxiliary substrate comprising a second layer structure comprising a second auxiliary layer.

FIG. 6C shows a wafer composite comprising the donor substrate 100, the auxiliary substrate 300 and a layer structure lying therebetween and comprising a sacrificial layer 250 formed from the two partial sacrificial layers 251, 252 from FIG. 6B. The first auxiliary layer 211 is formed between the donor substrate 100 and the sacrificial layer 250 and the second auxiliary layer 221 is formed between the sacrificial layer 250 and the auxiliary substrate 300.

Figure 6D:
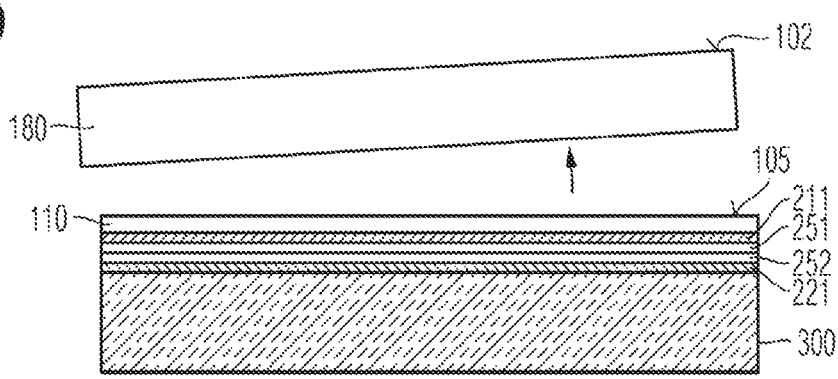
FIG. 6D shows a schematic vertical cross section through the wafer composite according to FIG. 6C when splitting off a main part of the donor substrate from a component layer along the defect layer.

According to FIG. 6D, a main part 180 of the donor substrate 100 can be separated off from the component layer 110 according to a method described in association with FIG. 5C and FIG. 5D.

Figure 6E:
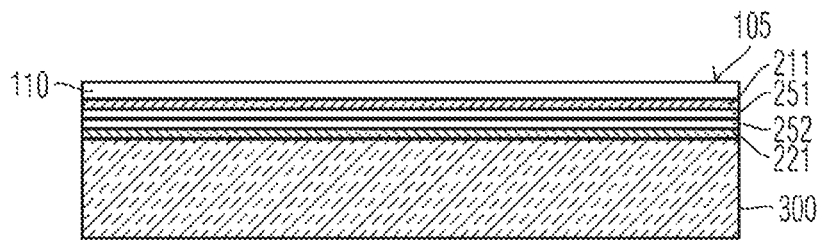
FIG. 6E shows a schematic vertical cross section through the wafer composite from FIG. 6D after splitting off the main part of the donor substrate.

FIG. 6E shows the remaining wafer composite comprising the component layer 110 obtained from the donor substrate 100, the layer thickness of which component layer can be increased to a target layer thickness of at least 10 μm by means of an epitaxial method. Doped regions 195 of functional elements 190 of semiconductor components are formed in the component layer 110 reinforced in this way.

Figure 6F:
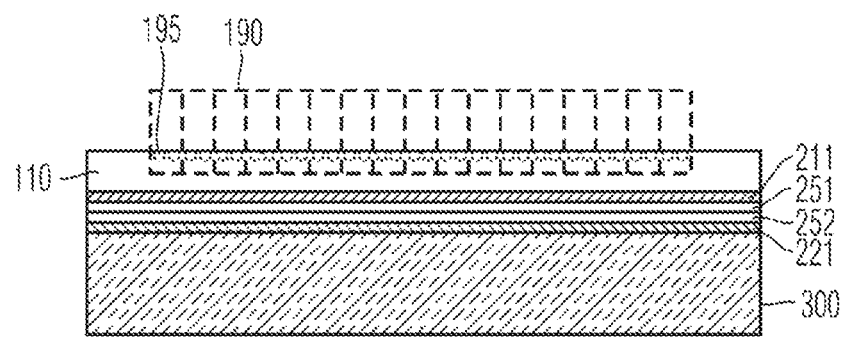
FIG. 6F shows a schematic vertical cross section through the wafer composite from FIG. 6E after extending the component layer by an epitaxial layer and after forming functional elements in the component layer.

FIG. 6F shows the component layer 110 with functional elements 190. Further layers, for example a metallization layer 115 and an insulation layer 114 separating the metallization layer 115 from parts of the component layer 110, can be formed on a process surface 105 opposite to the auxiliary substrate 300 on the front side of the component layer 110. On the front side of the component layer 110, an auxiliary carrier 400 can be connected to the metallization layer 115, for example by adhesive bonding or bonding.

Figure 6G:
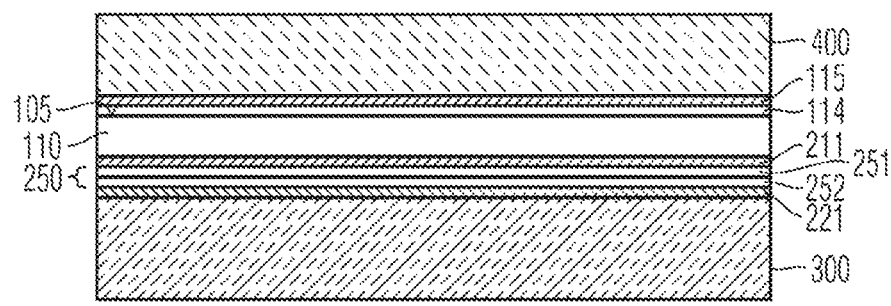
FIG. 6G shows a schematic vertical cross section through the wafer composite from FIG. 6F after applying an auxiliary carrier on the side of the component layer.

FIG. 6G shows a wafer composite comprising the auxiliary carrier 400. The layer structure 200 between the first substrate surface 101 of the donor substrate 100 and the main surface 301 of the auxiliary substrate 300 comprises a sacrificial layer 250 formed from the partial sacrificial layers 251, 252, said sacrificial layer being separated from the component layer 110 by the first auxiliary layer 211 and from the auxiliary substrate 300 by the second auxiliary layer 221 and being embedded between the two auxiliary layers 211, 221.

Figure 6H:
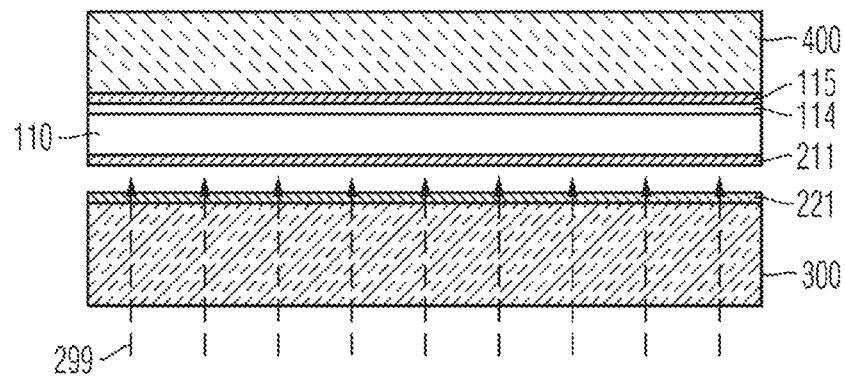
FIG. 6H shows a schematic vertical cross section through the wafer composite from FIG. 6G during impingement with a laser beam for separating off the auxiliary substrate.

FIG. 6H shows a laser beam 299 which passes through the auxiliary substrate 300 and focuses in the sacrificial layer 250 can be reflected with high efficiency at least at the first auxiliary layer 211, whereby the first auxiliary layer 211 can attenuate an undesired heating-up of the component layer 110 as a result of scattered laser radiation. By way of example, at the auxiliary layer 211 a reflectance for the laser beam 299 can be at least 50%, e.g. at least 80% or more than 90%. Alternatively or additionally, the first auxiliary layer 211 can thermally insulate the component layer 110 from the heat generated in the region of the sacrificial layer 250 by virtue of a higher specific heat capacity and/or poor thermal conductivity.

The second auxiliary layer 221 can have properties with regard to heat capacity and thermal conductivity which are the same as or similar to those of the first auxiliary layer 211 and can thus further increase the efficiency of the heat input into the region of the sacrificial layer 250. According to other embodiments, only the first or the second auxiliary layer 211, 221 is provided.

At least the first auxiliary layer 211 can be for example a metal-containing layer which remains as a metallization layer on the component layer 110, and form a rear-side metallization of the finalized semiconductor component.

FIGS. 7A to 7D relate to a method in which a metallization layer 213 is firstly formed on the auxiliary substrate 300 and later transferred to a component layer 110.

Figure 7A:
FIG. 7A shows a schematic vertical cross section through a donor substrate in order to illustrate a method for producing semiconductor components in accordance with one embodiment relating to a transfer of a metallic auxiliary layer from an auxiliary substrate to a component layer.

FIG. 7A shows a bare donor substrate 100, composed of monocrystalline SiC, for example, which is uncovered at a first substrate surface 101.

On an auxiliary substrate 300 composed of monocrystalline or polycrystalline SiC, firstly a sacrificial layer 250 is deposited and a metallization layer 213 is deposited on the sacrificial layer 250.

Figure 7B:
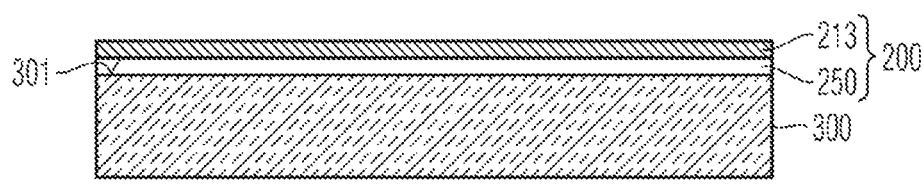
FIG. 7B shows a schematic vertical cross section through an auxiliary substrate after applying a layer structure comprising a sacrificial layer and a metal-containing layer on the sacrificial layer.

FIG. 7B shows the auxiliary substrate 300 with a layer structure 200 comprising the metallization layer 213 and the sacrificial layer 250, wherein the sacrificial layer 250 bears directly on a main surface 301 of the auxiliary substrate 300 and the metallization layer 213 bears on the sacrificial layer 250. The donor substrate 100 from FIG. 7A can be bonded onto the metallization layer 213.

From the donor substrate 100, in accordance with the methods described in detail above, it is possible to split off a main part from a component layer 110, to increase the layer thickness of the remaining component layer 110 by means of an epitaxy method and to form doped regions of functional elements of semiconductor components in the reinforced component layer 110.

Figure 7C:
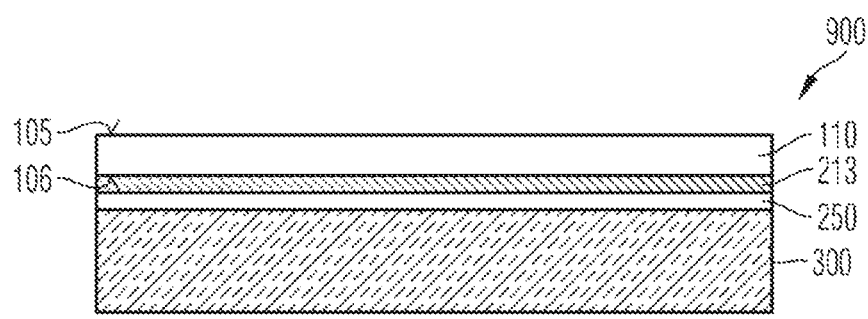
FIG. 7C shows a schematic vertical cross section through a wafer composite comprising the auxiliary substrate from FIG. 7B and the donor substrate from FIG. 7A.

FIG. 7C shows a wafer composite 900 comprising the component layer 110 bonded onto the metallization layer 213. The component layer 110 is separated from the auxiliary substrate 300 if appropriate with the aid of an auxiliary carrier as described with reference to FIG. 6G.

Figure 7D:
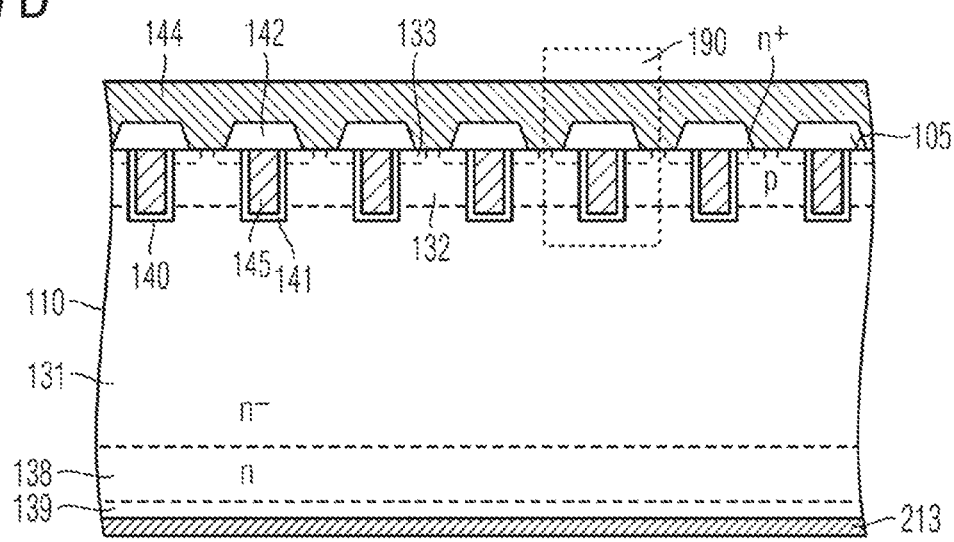
FIG. 7D shows a schematic vertical cross section through the component layer from FIG. 7C separated off from the auxiliary substrate.

FIG. 7D shows details of functional elements 190 in accordance with one exemplary embodiment relating to vertical power semiconductors with a current flow between a component front side and a component rear side.

In this exemplary embodiment, the functional elements 190 are transistor cells having source regions 133 formed along the process surface 105 and body regions 132 separating the source regions 133 from a weakly doped drift zone 131 formed in the component layer 110. The transistor cells furthermore comprise gate structures 140 having a gate electrode 145 and a gate dielectric 141 separating the gate electrode 145 from the semiconductor material of the component layer 110. The gate structures 140 can extend as shown from the process surface 105 into the component layer 110 (so-called trench gate structure) or can be formed above the process surface 105 and outside the component layer 110. An interlayer dielectric 142 separates the gate electrode 145 from a front-side metallization layer 144.

The metallization layer 213 can directly adjoin a highly doped contact layer 139 in the component layer 110. A field stop layer 138 can be formed between the highly doped contact layer 139 and the weakly doped drift zone 131, the dopant concentration of which field stop layer is higher than in the drift zone 131 but lower than in the contact layer 139. The transistor cells can be n-channel transistor cells. The highly doped contact layer 139 can be of the conductivity type of the source regions 133 or of the conductivity type of the body regions 132.

The field stop layer 138 can be formed for example by varying the in-situ doping during the epitaxy.

As shown in FIG. 7D, the metallization layer 213 remains connected to the first component layer 110 and can form for example a drain electrode of the semiconductor component. The heat input for the thermal decomposition of the sacrificial layer 250 improves the bonding of the metallization layer 213 to the component layer 110.

The method shown in FIGS. 8A to 8E relates to the bonding of two metallic layers 214, 215.

Figure 8A:
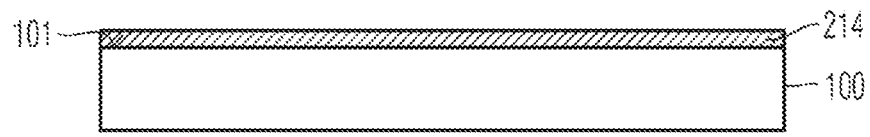
FIG. 8A shows a schematic vertical cross section through a donor substrate comprising a first layer structure comprising a first metal-containing layer in order to illustrate a method for producing semiconductor components in accordance with a further embodiment relating to metallic bonding.

FIG. 8A shows a first metallic layer 214 applied on a first substrate surface 101 of a donor substrate 100.

Figure 8B:
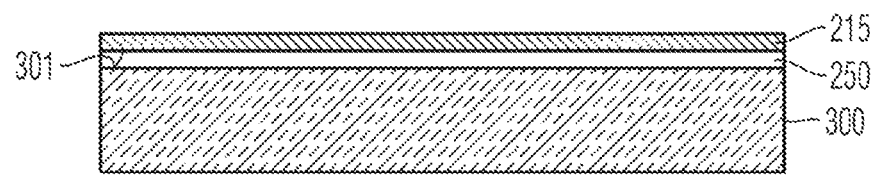
FIG. 8B shows a schematic vertical cross section through an auxiliary substrate after applying a second layer structure comprising a sacrificial layer and a second metal-containing layer.

FIG. 8B shows a sacrificial layer 250 applied on a main surface 301 of an auxiliary substrate 300, and a second metallic layer 215 applied on the sacrificial layer 250. The first metallic layer 214 and the second metallic layer 215 can be composed of the same material or of different materials. The first metallic layer 214 on the donor substrate 100 is connected to the second metallic layer on the auxiliary substrate 300, e.g. by bonding.

Figure 8C:
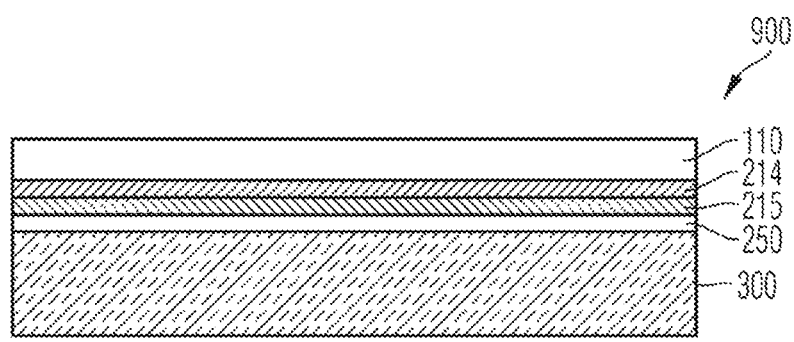
FIG. 8C shows a schematic vertical cross section through a wafer composite comprising the auxiliary substrate according to FIG. 8B after forming a component layer from the donor substrate from FIG. 8A.
Figure 8D:
FIG. 8D shows a schematic vertical cross section through the wafer composite according to FIG. 8C when separating the component layer from the auxiliary substrate by thermal decomposition of the sacrificial layer.
Figure 8E:
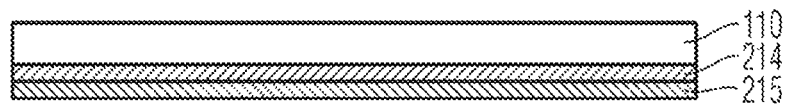
FIG. 8E shows a schematic vertical cross section through the component layer from FIG. 8D separated off from the auxiliary substrate.

FIG. 8C shows the wafer composite 900 produced as a result of the bonding and comprising a component layer 110 that arose from the donor substrate 100 from FIG. 8A. During the process of separating the component layer 110 from the auxiliary substrate 300 as shown in FIG. 8D, both metallic layers 214, 215 remain as part of the rear-side metallization on the rear side of the component layer 110, as shown in FIG. 8E.

Figure 9A:
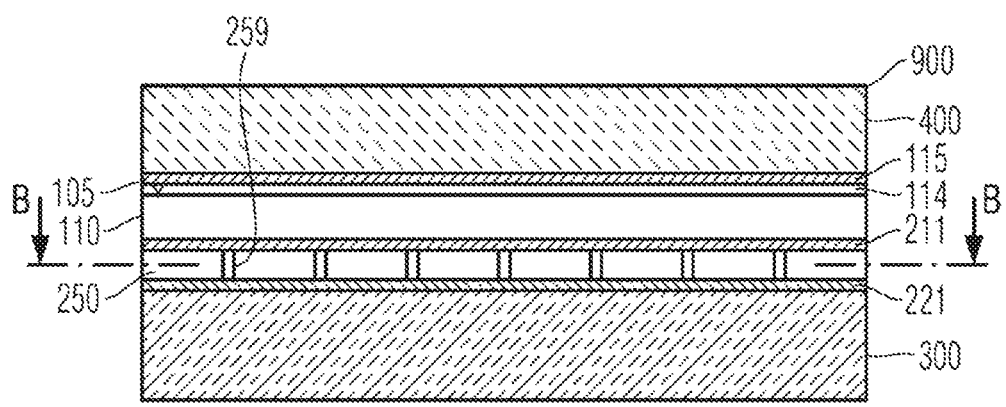
FIG. 9A shows a schematic vertical cross section through a wafer composite with sacrificial layer in accordance with a further exemplary embodiment.
Figure 9B:
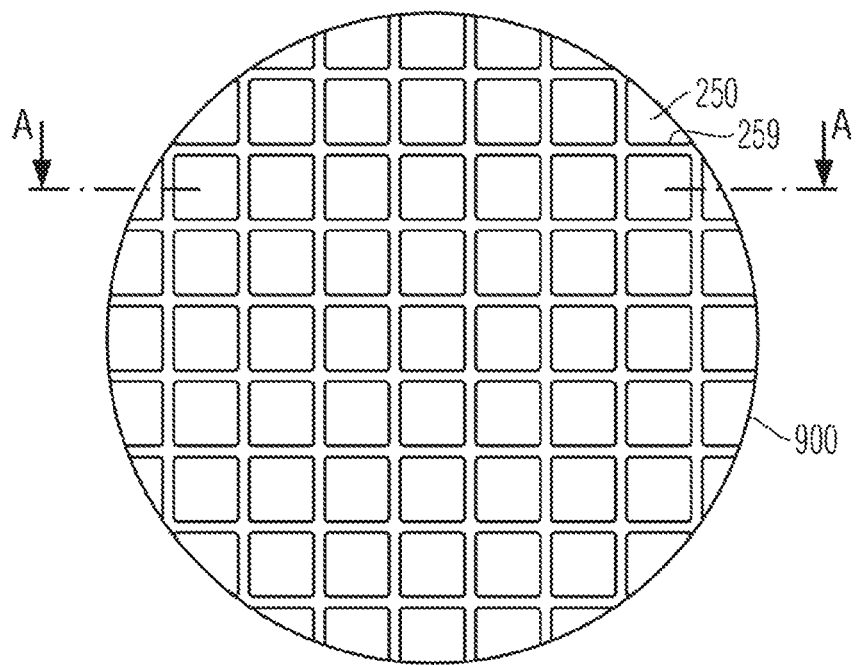
FIG. 9B shows a schematic horizontal cross section through the wafer composite according to FIG. 9A along the sectional line B-B.

FIGS. 9A and 9B show a wafer composite 900, comprising a component layer 110 composed of a first crystalline semiconductor material and an auxiliary substrate 300 composed of a second crystalline semiconductor material composed of the same elements as the first crystalline semiconductor material, wherein the first and second semiconductor materials differ from one another at least in a doping or a crystal shape. The wafer composite additionally comprises a layer structure 200 comprising at least one sacrificial layer 250, said layer structure connecting the auxiliary substrate 300 to the component layer 110. By way of example, the first and second crystalline semiconductor materials are SiC crystals, wherein the sacrificial layer 250 is thermally stable up to 1700° C. and neither decomposes nor melts in the process, and it decomposes at a temperature of between 1700° C. and 2000° C. By way of example, the sacrificial layer 250 is composed of silicon nitride.

In accordance with other embodiments, in which the component layer 110 is not based on SiC, but rather for example on Si, SiGe, Ge, GaN or GaAs the sacrificial layer 250 can melt or decompose at temperatures of between 1200° C. and 1800° C. By way of example, the sacrificial layer 250 is composed of silicon oxide.

The sacrificial layer 250 can be an unstructured, continuous layer that completely fills the interspace between the two adjoining layers. In accordance with other embodiments, channels 259 can be formed in the sacrificial layer 250, said channels emerging toward the outside at the outer edge of the wafer composite 900, i.e. being open at the outer edge, and guiding toward the outside thermal decomposition products that arise during the thermal decomposition of the sacrificial layer 250. The arrangement of the channels can be irregular or regular, wherein a pattern in which the channels are arranged can repeat at regular intervals along at least one direction, e.g. along a circular line around a horizontal mid-point of the sacrificial layer 250, in a radial direction with respect to the horizontal mid-point or along at least one of two orthogonal, straight horizontal directions.

By way of example, the channels 259 illustrated in FIG. 9B form a regular lattice having rectangular meshes in a horizontal cross section. The channels 259 are suitable for carrying away gaseous decomposition products that arise during the decomposition of the sacrificial layer 250 in the interior of the wafer composite 900, from the inside toward the outside. For further details of the wafer composite 900, reference is made to the description concerning the other figures.

Figure 10:
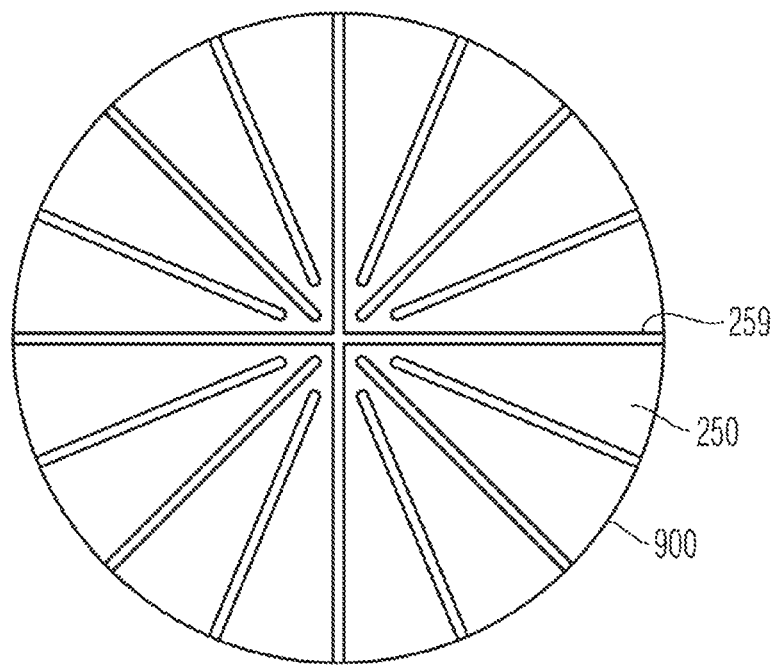
FIG. 10 shows a schematic horizontal cross section through a wafer composite in the plane of a sacrificial layer having radial channels in accordance with another embodiment.

In accordance with FIG. 10, the channels 259 formed in the sacrificial layer 250 lead radially toward the outside, such that decomposition products can be carried away on a direct path.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method for producing a semiconductor component, comprising:
providing a wafer composite comprising an auxiliary substrate, a donor substrate and a sacrificial layer formed between the donor substrate and the auxiliary substrate;
forming functional elements of the semiconductor component in a component layer, comprising at least one partial layer of the donor substrate; and
separating the auxiliary substrate from the component layer by heat input into the sacrificial layer.

2. The method of claim 1, wherein providing the wafer composite comprises:
forming a layer structure, which comprises at least one part of the sacrificial layer, on at least one of a first substrate surface of the donor substrate and a main surface of the auxiliary substrate; and
connecting the donor substrate to the auxiliary substrate, wherein the layer structure is arranged between the donor substrate and the auxiliary substrate.

3. The method of claim 2, wherein forming the layer structure comprises applying a first layer structure on the substrate surface of the donor substrate.

4. The method of claim 3, wherein the first layer structure comprises the sacrificial layer.

5. The method of claim 2, wherein the first layer structure comprises a first auxiliary layer which is applied directly on the first substrate surface.

6. The method of claim 5, wherein a material of the first auxiliary layer has a higher specific heat capacity and/or a lower specific thermal conductivity than a material of the donor substrate.

7. The method of claim 5, wherein the first auxiliary layer is a metallic layer.

8. The method of claim 2, wherein forming the layer structure comprises applying a second layer structure comprising the sacrificial layer on the main surface of the auxiliary substrate.

9. The method of claim 8, wherein the first layer structure comprises a first partial sacrificial layer of the sacrificial layer.

10. The method of claim 9, wherein forming the layer structure comprises applying the second layer structure comprising a second partial sacrificial layer of the sacrificial layer on the main surface of the auxiliary substrate.

11. The method of claim 1, wherein the sacrificial layer melts or decomposes with emission of gaseous decomposition products as a result of the heat input.

12. The method of claim 1, wherein the heat input is provided by a laser beam that focuses in the sacrificial layer.

13. The method of claim 1, furthermore comprising:
splitting, before the separating, the donor substrate along a plane parallel to the sacrificial layer,
wherein the component layer remains connected to the auxiliary substrate and a main part of the donor substrate which is separated off from the wafer composite.

14. The method of claim 13, wherein before the splitting, a planar disturbance of a crystal structure of the donor substrate is formed in the plane parallel to the sacrificial layer.

15. The method of claim 13, wherein before the splitting, a defect layer is formed by implantation of light ions in the donor substrate, and wherein before the splitting, a mechanical stability of the defect layer is reduced by thermal treatment.

16. The method of claim 1, wherein before forming the functional elements, a layer thickness of the component layer is increased.

17. The method of claim 1, wherein channels are formed in the sacrificial layer, the channels being open at an outer edge of the sacrificial layer.

18. The method of claim 1, wherein the donor substrate comprises a first crystalline semiconductor material and the auxiliary substrate comprises a second crystalline semiconductor material comprising the same elements.

19. The method of claim 18, wherein the first and second semiconductor materials differ from one another in a doping and/or a crystal shape.

20. The method of claim 1, wherein the donor substrate and the auxiliary substrate comprise crystalline silicon carbide, wherein the sacrificial layer is thermally stable and solid up to at least 1700° C., and wherein the sacrificial layer is decomposable into gaseous decomposition products at a temperature of between 1700° C. and 2000° C.

21. The method of claim 1, wherein the sacrificial layer contains silicon nitride.

22. The method of claim 1, wherein the donor substrate comprises crystalline gallium nitride, gallium arsenide, silicon or germanium, and wherein the sacrificial layer is thermally stable and solid up to at least 1200° C.

23. The method of claim 22, wherein the sacrificial layer comprises silicon oxide.

\* \* \* \* \*